United States Patent [19]

Oohara et al.

[11] Patent Number: 5,145,793
[45] Date of Patent: Sep. 8, 1992

[54] MANUFACTURING A GALLIUM ARSENIDE SOLAR CELL ON A SILICON SUBSTRATE

[75] Inventors: Takahiko Oohara, Higashimurayama; Yoshiro Ohmachi, Higashiyamato; Yoshiaki Kadota, Ebina; Kotaro Mitsui, Itami; Nobuyoshi Ogasawara, Itami; Takashi Nishimura, Itami, all of Japan

[73] Assignees: Mitsubishi Denki Kabushiki Kaisha; Nippon Telegraph and Telephone Corporation, both of Tokyo, Japan

[21] Appl. No.: 684,338

[22] Filed: Apr. 12, 1991

[30] Foreign Application Priority Data

Apr. 13, 1990 [JP] Japan .................................. 2-98802

[51] Int. Cl.$^5$ .................. H01L 31/18; H01L 31/0328
[52] U.S. Cl. ......................................... 437/5; 136/256; 136/262; 437/126; 437/132; 437/976
[58] Field of Search .................. 437/5, 126, 132, 976, 437/5; 136/262, 256

[56] References Cited

U.S. PATENT DOCUMENTS 4,830,984   5/1989   Purdes ..................... 437/126

FOREIGN PATENT DOCUMENTS

| | | |
|---|---|---|
| 0328405 | 8/1989 | European Pat. Off. . |
| 61-225816 | 10/1986 | Japan . |
| 63-211774 | 9/1988 | Japan .................. 136/262 |
| 63-236308 | 10/1988 | Japan . |
| 1-8612 | 4/1989 | Japan ...................... 437/5 |
| 63-302576 | 4/1989 | Japan ...................... 437/5 |
| 1-61958 | 6/1989 | Japan .................... 136/256 |
| 1-165178 | 6/1989 | Japan .................... 136/262 |
| 1-82572 | 7/1989 | Japan .................... 136/262 |

OTHER PUBLICATIONS

Ackaert et al, "Crack Formation And Thermal Stress Relaxation of GaAs On Si Growth By Metalorganic Vapor Phase Epitaxy", Applied Physics Letters, vol. 55, No. 2, 1989, pp. 2187–2189.
O'Hara et al, "High Efficiency GaAs Solar Cells Fabricated On Si Substrates", IEEE Photovoltaic Specialists Conference, 1987, pp. 329–344.
Ackaert et al, "Crack Formation . . . Vapor Phase Epitaxy", *Applied Physics Letters*, vol. 55, No. 21, 1989, pp. 2187–2189.

*Primary Examiner*—Aaron Weisstuch
*Attorney, Agent, or Firm*—Leydig, Voit & Mayer

[57] ABSTRACT

A method for manufacturing a solar cell which includes at least a first GaAs layer of a first conductivity type and a second GaAs layer of a second conducitivity type sequentially formed on a first main surface of an Si substrate of the first conductivity type, a first electrode formed on a second main surface opposite to the first main surface of the Si substrate and a second electrode formed on the second GaAs layer. The method includes a first step of forming a layer comprising a material having a thermal expansion coefficient smaller than that of Si on the second main surface of the Si substrate at a temperature close to room temperature and a second step of sequentially forming the first and second GaAs layers on the first main surface of the Si substrate.

17 Claims, 16 Drawing Sheets

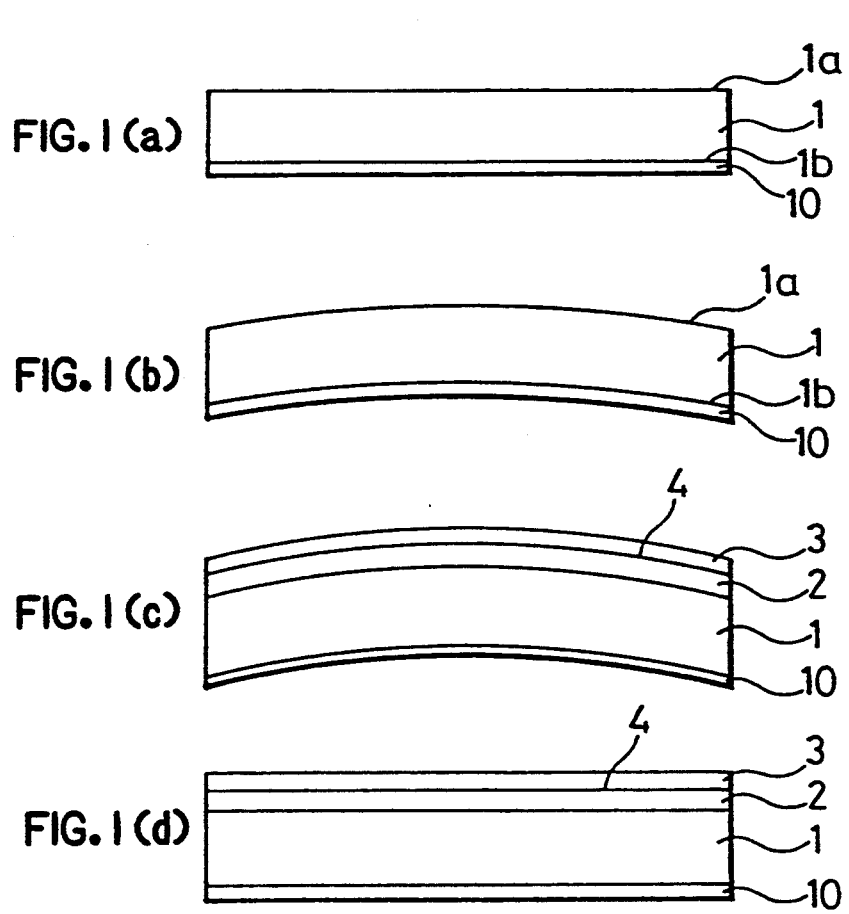

F I G. 16
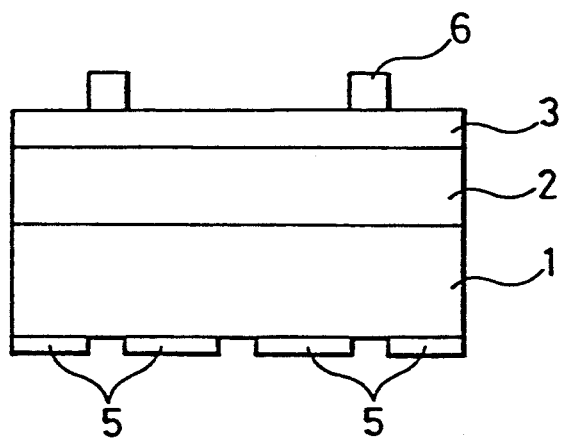
F I G. 17
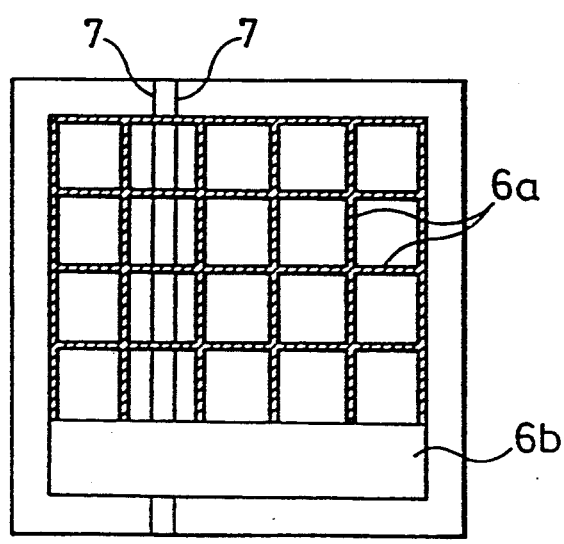

MANUFACTURING A GALLIUM ARSENIDE SOLAR CELL ON A SILICON SUBSTRATE

FIELD OF THE INVENTION

The present invention relates to a GaAs solar cell on a Si substrate and a method for manufacturing the same.

BACKGROUND OF THE INVENTION

FIGS. 20(a) and 20(b) are views showing a structure of a conventional GaAs solar cell on a Si substrate, in which FIG. 20(a) is a plan view and FIG. 20(b) is a sectional view taken along a line 20(b)-20(b) in FIG. 20(a). In the figures, reference numeral 1 designates a Si substrate. An n type GaAs layer 2 and a p type GaAs layer 3 which serve as active layers are laminated on a first main surface 1a of the Si substrate 1 and then an anode electrode (p type electrode) 6 is formed on the p type GaAs layer 3 and a cathode electrode (n type electrode) 5 is provided on a second main surface 1b of the Si substrate 1. Thus, a solar cell 21 is formed.

The GaAs solar cell 21 on the Si substrate is normally manufactured by the following method.

First, the n type GaAs layer 2 and the p type GaAs layer 3 are sequentially formed on the first main surface 1a of the n type Si substrate 1 having a surface orientation of approximately (100) by a method of crystal growth of a compound semiconductor, such as MOCVD. Thus, a pn junction 4 which exhibits the photovoltaic effect is formed. Then, as an electrode for collecting the photocurrent, the anode electrode (p side electrode) 6 is selectively formed on the p type GaAs and the cathode electrode (n side electrode) 5 is formed on the whole surface of the second main surface 1b of the Si substrate 1. The anode electrode 6 comprises collecting electrodes 6a for collecting a photoelectric current and a common electrode 6b for connecting the collecting electrodes to an outside circuit. In addition, these electrodes are formed by sputtering or a vapor deposition method and Ti/Ag is normally used.

However, the conventional GaAs solar cell on the Si substrate has the following problems. That is, since the n type GaAs layer 2 and the p type GaAs layer 3 are usually formed at a high temperature of 700° to 800° C., when a wafer on which the above GaAs layers are formed reaches room temperature, a large warpage is generated because of the difference in thermal expansion coefficients between GaAs and Si as shown in FIG. 20(b). As the thickness of the GaAs layer is increased, the degree of this warpage increases. When the thickness of the GaAs layer exceeds 3 μm, a crack is generated. On the other hand, as the thickness of the GaAs layer is increased, the dislocation density in the GaAs layer is reduced. Therefore, in order to assure sufficient performance as a solar cell, the thickness should be 4 to 5 μm. Thus, a crack is generated in the operational layer (active layer) of the conventional solar cell. Particularly, a region surrounded by the crack 7 on which the collecting electrode 6a is not provided, which region is shown by slanted lines in FIG. 20(a), is a loss region because the generated photoelectric current can not be collected.

In addition, even if a crack is not generated, since considerable thermal stress remains in the GaAs layer, when slight stress is applied from the outside, a crack is easily generated in the GaAs layer. Since the warpage is concave when the GaAs layer is on the upper side as shown in FIG. 20(b), a crack is easily generated when a stress is applied from the direction of the second main surface 1b of the Si substrate, that is, when a tensile stress is applied to the GaAs layer. Therefore, when the wafer is flattened in a photolithography process for patterning the p type electrode 6 or when interconnector welding is performed on the first electrode 5 side in the assembling process, a crack is obviously generated.

Meanwhile, GaAs on a Si substrate in which a crack is prevented from being generated later by intentionally generating a crack at a predetermined position to relieve thermal stress is disclosed in *Appl. Phys. Lett.* 55(21), 20 Nov. 1989, pp.2187 to 2189. FIG. 21 is a view showing a principle for manufacturing the above solar cell. In FIG. 21, reference numeral 25 designates a mask formed on the Si substrate, which is used for selectively growing GaAs, reference numeral 26 designates a wedge, and reference numeral 27 designates a crack generated in the GaAs layer from the end of the wedge.

According to this conventional example, when the GaAs active layer is selectively grown on the Si substrate using the mask having the wedge 26, the crack 27 is generated in the GaAs layer from an end of the wedge 26. Thus, thermal stress in an element is relieved by the crack, so that the crack is prevented from being generated later. Therefore, it is possible to prevent generation of an inactive region by forming the collecting electrode so that no region is surrounded by a crack and in which the collecting electrode exists with due regard to the position of the crack 27.

However, the Si substrate surface is difficult to satisfactorily clean in a case where GaAs is selectively grown by using the mask as shown in the conventional example, and it is desired that the Si substrate on which GaAs is to be grown should be clean when the GaAs solar cell on the Si substrate is manufactured.

SUMMARY OF THE INVENTION

The present invention was made to solve the above problems and it is an object of the present invention to provide a GaAs solar cell on an Si substrate preventing generation of a crack or reducing its effect even if a crack is generated and a method for manufacturing the same.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a method for manufacturing a solar cell of the present invention, a layer comprising a material having a thermal expansion coefficient smaller than that of the Si substrate is formed on a second main surface of a first conductivity type Si substrate at a temperature close to room temperature and then the first and second GaAs layers of the first and second conductivity types, which serve as active layers, are sequentially formed on a first main surface of the Si substrate. Thus, the layer formed of the material having a thermal expansion coefficient smaller than that of the Si substrate warps the Si substrate into a convex shape at the temperature at which the GaAs layer is formed, that is, a stress is generated on the first main surface of the Si substrate. As a result, residual stress of the GaAs layer can be reduced and also the degree of its warpage can be reduced at room temperature after the GaAs layer is formed.

In addition, a solar cell in accordance with the present invention comprises a layer comprising a conductive material having a thermal expansion coefficient smaller than that of Si which is formed on the second main surface of the Si substrate at a temperature close to room temperature before the first and second GaAs layers of the first and second conductivity types, which serve as the active layers, are formed on the first main surface of the first conductivity type Si substrate. Therefore, this layer can be used as an electrode.

In addition, according to a method for manufacturing a solar cell of the present invention, a GaAs buffer layer of a first conductivity type containing a high dopant impurity concentration is formed on the first main surface of a first conductivity type Si substrate and then a layer comprising a material having a thermal expansion coefficient smaller than that of the Si substrate is formed on the second main surface of the Si substrate at a temperature close to room temperature. First and second GaAs layers of first and second conductivity types are sequentially formed on the buffer layer. As a result, an active layer can be formed on the clean surface of the Si substrate having no thermal stress.

In addition, according to a method for manufacturing a solar cell of the present invention, a GaAs buffer layer of a first conductivity type containing a high dopant impurity concentration is formed on the first main surface of a first conductivity type Si substrate, a wedge-shaped notched part is provided on a side surface of the buffer layer or a pinhole having a predetermined configuration is provided on the buffer layer and then an active layer is formed, which comprises a first conductivity type GaAs layer and a second conductivity type GaAs layer on the buffer layer with a crack generated from the end of the wedge-shaped notched part or from the pinhole. As a result, the active layer can be formed on the clean Si substrate surface. In addition, when the crack is intentionally formed on a predetermined position, thermal stress in the element can be relieved and the crack is prevented from being accidentally generated later.

In addition, a solar cell of the present invention comprises a plurality of island-shaped buffer layers formed in one element region which are formed by dividing a GaAs buffer layer formed on the first main surface of a first conductivity type Si substrate, containing a high dopant impurity concentration with intersecting grooves. Active layers formed of first and second GaAs layers of first and second conductivity types are sequentially formed on each island-shaped buffer layer, in which the second conductivity type GaAs layer in each island is connected to at least one second conductivity type collecting electrode connected to a common electrode. As a result, mechanical force applied to the GaAs crystal is reduced because the size of the island-shaped active layer is small, so that cracks are prevented.

In addition, according to a solar cell of the present invention, at least one of an electrode on the substrate side and an electrode on the light input side is formed of a base metal which is likely to be plastically deformed. As a result, stress applied to the GaAs layer at a peripheral part of the electrode can be reduced.

In addition, a solar cell of the present invention comprises electrodes on the substrate side which are separately arranged on the second main surface of the Si substrate. As a result, stress applied to the semiconductor by an electrode material is diffused, so that cracking is prevented.

In addition, a solar cell of the present invention comprises an electrode on the light input side which is patterned so that the collecting electrode is not connected to a region divided by another active region, such as a closed-loop configuration or a configuration in which the collecting electrodes and the common electrode do not cross at right angles when a crack is generated in the active layer. As a result, a loss region can be prevented from being generated when a crack is generated later.

BRIEF DESCRIPTION OF THE DRAWINGS

FIGS. 1(a)–1(d) are sectional views showing a method for manufacturing a GaAs solar cell on a Si substrate in accordance with a first embodiment of the present invention;

FIG. 16 is a sectional view showing a GaAs solar cell on a Si substrate in accordance with a seventh embodiment of the present invention;

FIG. 17 is a plan view showing a GaAs solar cell on a Si substrate in accordance with an eighth embodiment of the present invention;

DETAILED DESCRIPTION OF THE PREFERRED EMBODIMENT

Figure 2B:
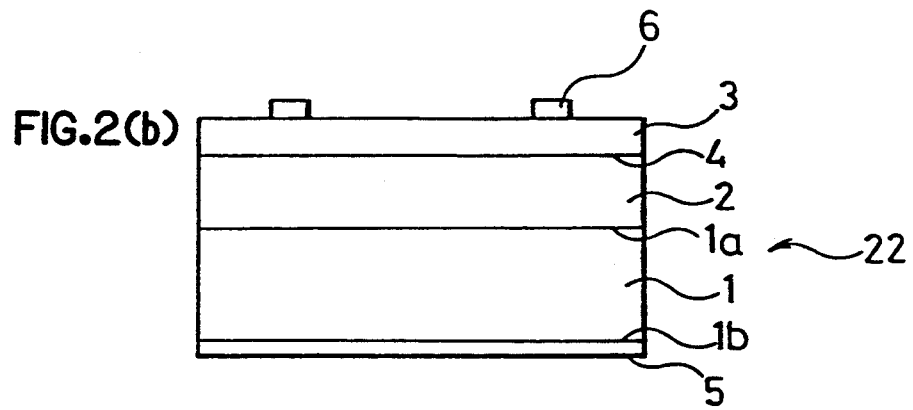
FIG. 2(b) is a sectional view taken along a line 2(b)–2(b) in FIG. 2(a)

Embodiments of the present invention will be described in reference to the drawings hereinafter.

FIGS. 1(a)–1(d) are sectional views showing a method for manufacturing a solar cell in accordance with a first embodiment of the present invention. In these figures, reference numeral 1 designates an n type Si substrate, reference numeral 1a designates a first main surface of the Si substrate 1, reference numeral 1b designates a second main surface opposite to the first main surface 1a. An n type GaAs layer 2 is arranged on the first main surface 1a of the Si substrate 1. A p type GaAs layer 3 is arranged on the n type GaAs layer 2. A pn junction 4 is formed between the n type GaAs layer 2 and the p type GaAs layer 3. Reference numeral 10 designates an auxiliary layer comprising a material having a thermal expansion coefficient smaller than that of Si, which is formed on a back surface of the Si substrate 1.

Next, the manufacturing steps will be described.

Figure 2A:
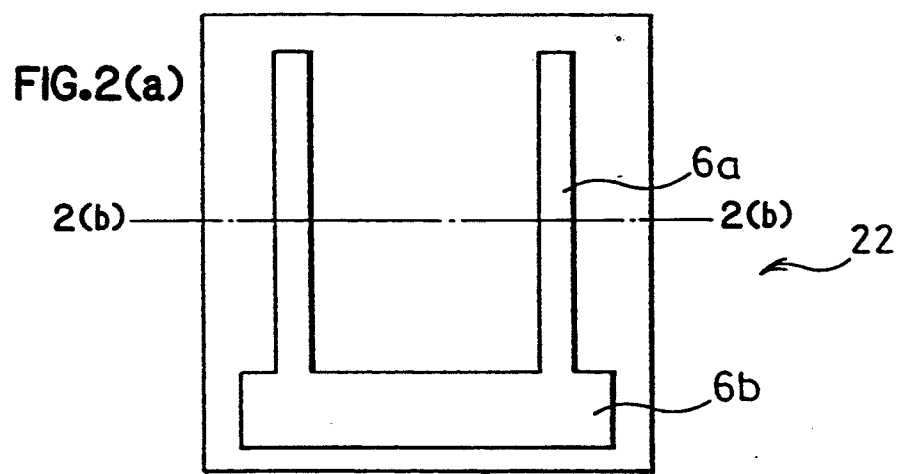
FIG. 2(a) is a plan view showing the GaAs solar cell on the Si substrate obtained by the manufacturing method shown in FIG. 1

First, the auxiliary layer 10 comprising a material having a thermal expansion coefficient smaller than that of Si is formed on the second main surface 1b of the n type Si substrate 1, a (100) surface whose surface orientation is inclined by 2 degrees in the <111> direction, at a temperature close to the room temperature as shown in FIG. 1(a). As a material of this auxiliary layer 10, boron nitride (BN), carbon (C), silicon dioxide (SiO$_2$) or the like is used. The auxiliary layer 10 is formed by sputtering or a photo-assisted chemical vapor deposition process. The respective thermal expansion coefficients of BN, C, and SiO$_2$ are $1.0\times10^{-6}$, $1.7\times10^{-6}$, $5\times10^{-7}$ [1/° C.] which are smaller than the $2.4\times10^{-6}$ [1/° C.] thermal expansion coefficient of Si. When the wafer is heated up to the temperature when the GaAs layer is formed, such as approximately 700° C., the Si substrate is warped into a convex shape as shown in FIG. 1(b) because of the difference in thermal expansion coefficient between the materials of Si and the auxiliary layer 10. In this state, the n type GaAs layer 2 and the p type GaAs layer 3 are formed by MOCVD, MBE or the like as shown in FIG. 1(c). Thereafter, when the wafer is taken out of the crystal growing apparatus at room temperature, an epitaxial wafer which is not warped and has no residual stress in the GaAs layer can be provided as shown in FIG. 1(d). The GaAs solar cell 22 on the Si substrate shown in FIG. 2 can be formed using the above epitaxial wafer by a room temperature method for manufacturing the solar cell. In FIG. 2, reference numeral 5 designates an n side electrode which is formed on the second main surface of the Si substrate by vapor deposition, sputtering, plating or the like using a metal material such as Ti/Au after the layer 10 having a thermal expansion coefficient smaller than that of Si is removed. In addition, reference numeral 6 designates a p side electrode which is selectively formed on a part of the surface of the p type GaAs layer 3 by photolithography or the like so that light may reach the pn junction 4 which generates a photoelectromotive force. The p side electrode 6 comprises collecting electrodes 6a for collecting the photoelectric current and a common electrode 6b for connecting the collecting electrode 6a to the outside circuit. The p side electrode 6 may be formed using the same material and method as those of the n side electrode 5.

As described above, since the flat epitaxial wafer can be formed in accordance with the first embodiment of the present invention, it is not necessary to apply stress from the outside to flatten the wafer in the step of photolithography which requires flatness or the step of grinding the back surface for adjusting its thickness when the solar cell is manufactured. As a result, a crack is prevented from being generated in the GaAs layers 2 and 3. In addition, since it is also not necessary to apply stress from the outside to flatten the wafer at the time of interconnecting the electrodes 5 and 6 in an assembling step, a crack is prevented from being generated. In addition, since an epitaxial wafer having no residual stress can be provided in the first embodiment of the present invention, cracking is prevented from being accidentally generated by a force applied from the outside in the manufacturing steps.

Figure 3:
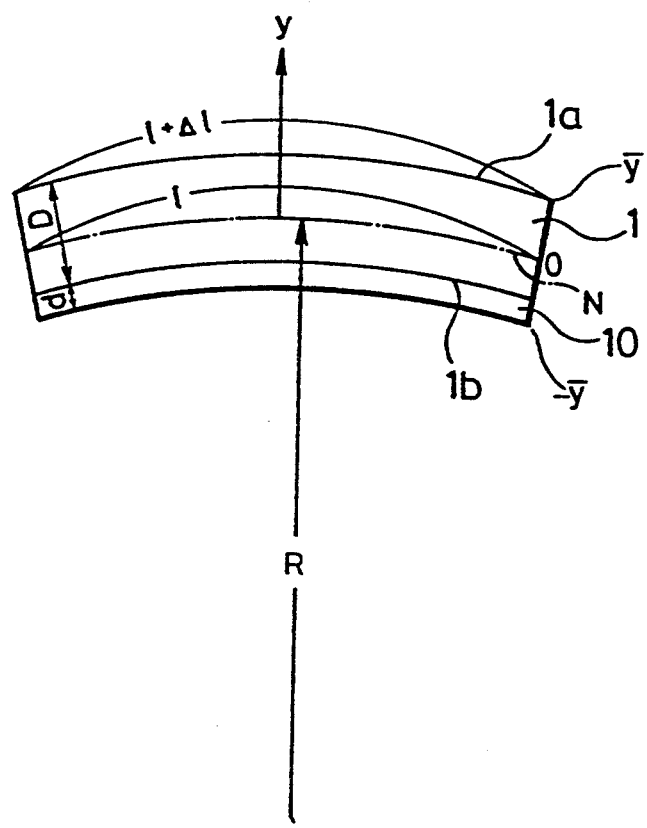
FIG. 3 is a view showing the warpage at a raised temperature in the step shown in FIG. 1(b)

Next, design of the thickness of the auxiliary layer 10 in which BN is used as a material which has a thermal expansion coefficient smaller than that of Si in accordance with the first embodiment of the present invention will be described with reference to FIG. 3. FIG. 3 is a schematic view showing a state of the wafer shown in FIG. 1(b). In FIG. 3, reference character R designates a radius of curvature of warpage and reference character D designates the thickness of the Si substrate and reference character d designates the thickness of BN formed at the room temperature. The warpage caused by thermal stress $\sigma$ is obtained as follows.

$$\frac{1}{R} = \frac{6d(1 - \nu_{Si})}{D^2 E_{Si}} \sigma \qquad (1)$$

where $E_{Si}$ and $\nu_{Si}$ are Young's modulus and Poisson's ratio, respectively. A neutral surface N of strain and stress exists in the wafer and its position is obtained as follows.

$$Y = \frac{D}{2} \cdot \frac{1 + 2t}{1 + et} \qquad (2)$$

where $t = d/D$, $$e = \left(\frac{E_{BN}}{1 - \nu_{BN}}\right) / \left(\frac{E_{Si}}{1 - \nu_{Si}}\right) \text{ and}$$

$E_{BN}$ and $\nu_{BN}$ are Young's modulus and Poisson's ratio for BN, respectively.

When a length of the wafer before deformation is l, the extension $\Delta l$ on the surface 1a is as follows.

$$\Delta \frac{Y}{R} l \qquad (3)$$

More specifically, when BN is formed on the back surface 1b of the Si substrate at the room temperature and then heated to the GaAs growing temperature, the 1a surface of the Si substrate on which GaAs is to be grown is extended to $l + \Delta l$. The thickness d of the BN should be determined so that the following equation may be implemented, that is, $$\frac{\Delta l}{l} = \alpha GaAs \Delta T \quad (4)$$

where αGaAs is the thermal expansion coefficient of GaAs and ΔT is the temperature difference. Meanwhile, when the thermal expansion coefficients of Si and BN are $\alpha_{Si}$ and $\alpha_{BN}$, respectively, since $\sigma = E_{BN}(\alpha_{BN}-\alpha_{Si})\Delta T/(1-\nu_{BN})$, $$d = [\{\alpha_{GaAs} - 3(\alpha_{Si} - \alpha_{BN})\}e \\ - \sqrt{\{\alpha_{GaAs} - 3(\alpha_{Si} - \alpha_{BN})\}^2 e^2} \\ \overline{-24\alpha_{GaAs}(\alpha_{Si} - \alpha_{BN})e}] \times D/12(\alpha_{Si} - \alpha_{BN})e$$

in view of the above equations (1), (2), (3) and (4).

When respective values are substituted, the thickness of BN is approximately 38 μm for a thickness of a Si substrate of 100 μm.

Figure 5:
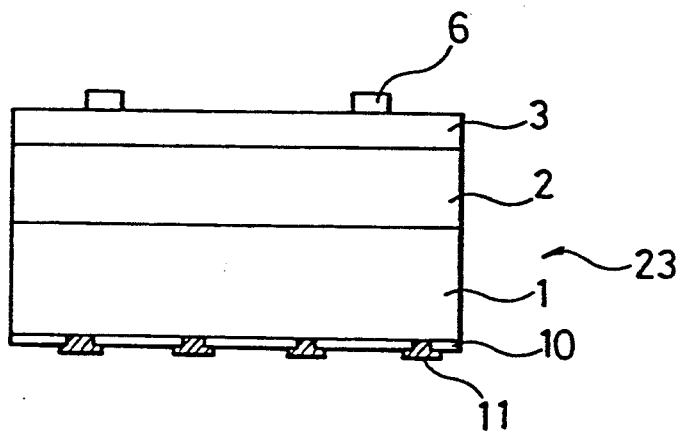
FIG. 5 is a sectional view showing a GaAs solar cell on a Si substrate in accordance with a second embodiment of the present invention.

Next, a second embodiment of the present invention will be described. Although the n electrode is formed on the second main surface 1b of the Si substrate after the layer 10 comprising a material whose thermal expansion coefficient is smaller than that of Si is removed in the above first embodiment of the present invention, a conductive material may be used as a material whose thermal expansion coefficient is smaller than that of Si, which serves as the n type electrode in the second embodiment of the present invention. As this material, a BN film containing carbon in high concentration may be used. This is formed by a reactive sputtering method using acetylene as reactive gas or photo-assisted chemical vapor deposition using diborane and ammonia as main gases and acetylene as a doping gas in which a BN sintered body is used as a target. When the specific resistance of the Si substrate is high, contact resistance between BN and Si becomes high. However, in this case, it is possible to reduce the contact resistance by selectively forming through holes on the BN film 10' and forming the metal electrode 11 comprising a material such as Ti/Au on the exposed second main surface of the Si substrate as shown in FIG. 5. In addition, an interconnecting part may be formed on the metal electrode 11. In this case, welding of the interconnector or the like can be performed on the metal electrode 11 more easily than on the BN film 10'.

Next, a third embodiment of the present invention will be described. FIGS. 4(a)-4(d) are sectional views showing method for manufacturing a solar cell in accordance with the third embodiment of the present invention. In these figures, the same references as in FIG. 1 designate the same or corresponding parts and reference numeral 12 designates an n+GaAs buffer layer.

Next, its manufacturing steps will be described.

Figure 4A:
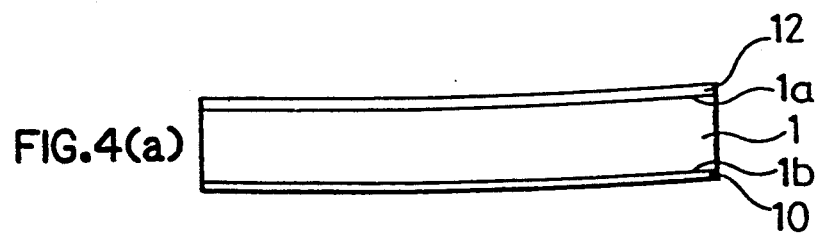
FIGS. 4(a)–4(d) are sectional views showing a method for manufacturing a GaAs solar cell on a Si substrate in accordance with a third embodiment of the present invention.
Figure 4B:
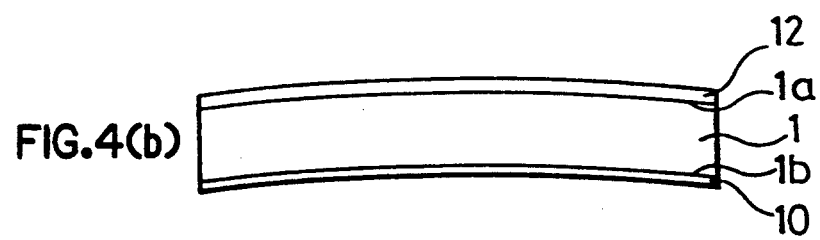
Figure 4C:
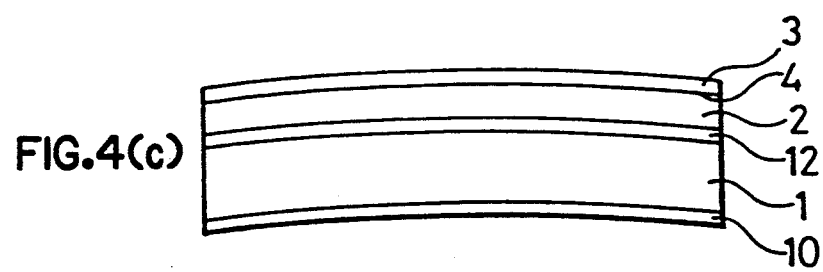
Figure 4D:
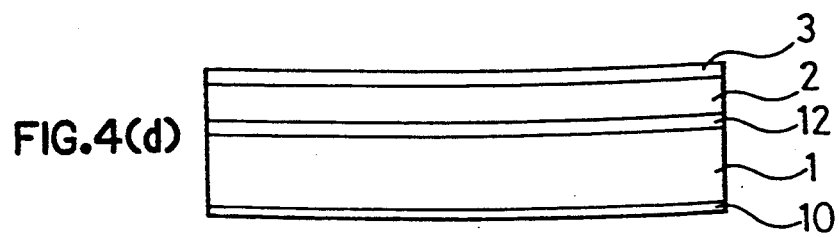

First, referring to FIG. 4(a), an n+ GaAs layer 12 having a thickness of approximately 2 μm is formed on the first main surface 1a of the Si substrate 1. Then, the BN film 10 is formed at the room temperature. In this case, unlike FIG. 1, the substrate is warped a little by the thermally induced stress of the n+ GaAs layer. However, when the thickness of the n+ GaAs layer is 2 μm or less, the degree of warpage can be disregarded. Then, referring to FIG. 4(b), when the wafer is heated up at a temperature when the GaAs layer is grown, it is warped as in FIG. 1(b). However, in this case the degree of warpage is smaller than that shown in FIG. 1(b) because of the n+ GaAs layer. Then, referring to FIG. 4(c), the n type GaAs layer 2 and the p type GaAs layer 3 which are necessary for the solar cell are formed and then the wafer is cooled to room temperature. Then, referring to FIG. 4(d), the degree of warpage can be considerably reduced as compared with a conventional example where there is no BN film. According to the third embodiment of the present invention, although there is little warpage, there are the following advantages as compared with the first embodiment of the present invention. When the GaAs layer is formed on the Si substrate in general, it is necessary to clean the surface of the Si substrate at a high temperature of 900° to 1000° C. before the GaAs layer is grown thereon. When a foreign material such as BN is formed on the second main surface of the Si substrate, the first main surface of the Si substrate is contaminated at the above high temperature processing, with the result that epitaxial growth of GaAs is not uniformly implemented. According to the embodiment shown in FIGS. 4(a)-4(d) when the GaAs layer is formed on the Si substrate, GaAs can be epitaxially grown on the clean Si substrate having no foreign material, so that a uniform grown layer is obtained. Thereafter, when the GaAs layer is formed at a temperature of 700° to 800° C. after the BN is formed at room temperature, because the n+ GaAs layer 12 is already formed, homoepitaxial growth can be implemented and then the GaAs layer is uniformly formed in a relatively easy manner. In addition, because it is grown at a relatively low temperature of 900° to 1000° C., the element can be prevented from being contaminated by BN.

FIGS. 6(a)-6(e) are sectional views showing a method for manufacturing a solar cell in accordance with a variation of the third embodiment of the present invention. In these figures, the same reference numerals as in FIG. 4 designate the same or corresponding parts and reference numerals 13 and 14 designate mesa gooves formed in the vicinity of the wafer.

Next, its manufacturing steps will be described hereinafter.

Figure 6:
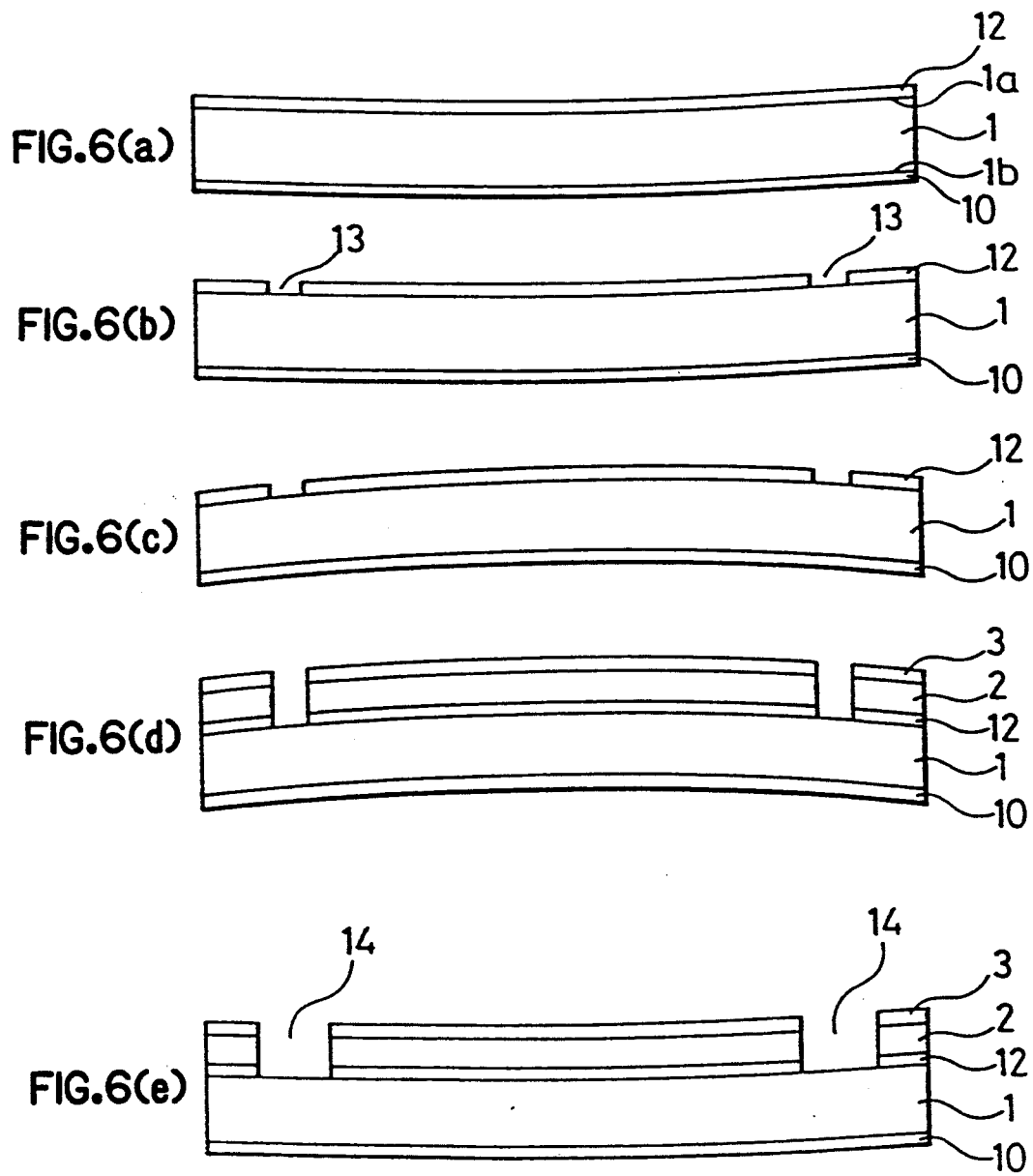
FIGS. 6(a)–6(e) are views showing a method for manufacturing a GaAs solar cell on a Si substrate in accordance with a variation of the third embodiment of the present invention.

First, referring to FIG. 6(a), the wafer is formed as in FIG. 4(a). Then, referring to FIG. 6(b), the BN film 10 is formed and then the mesa groove 13 is formed by selectively etching the n+ GaAs layer 12 so that a part of the Si substrate surface is exposed. Then, referring to FIG. 6(c), the wafer is heated up at 700° to 800° C. and it is warped. Then, referring to FIG. 6(d), the n type GaAs layer 2 and the p type GaAs layer 3 are formed. In this case, since a natural oxide film is formed on the Si surface which is exposed by the mesa groove, a GaAs crystal is not grown in the mesa but the GaAs layer is selectively grown on GaAs. Then, referring to FIG. 6(e), when the wafer is taken out of the GaAs crystal growing apparatus at room temperature, the degree of warpage is reduced as compared with that using the conventional method.

Figure 7:
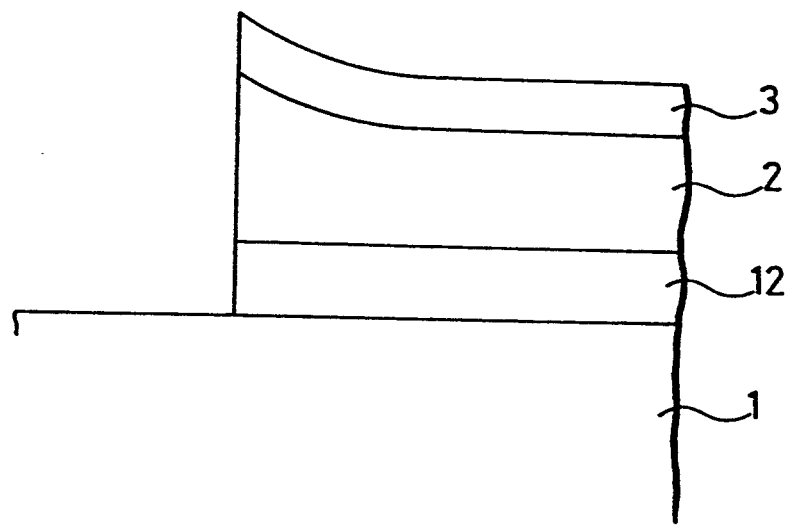
FIG. 7 is an enlarged view in the vicinity of a mesa in the step shown in FIG. 6(d)

In this variation, the mesa groove 14 whose width is larger than that of the mesa groove 13 is formed by selectively removing the GaAs layer in the vicinity of the mesa groove 13 formed after the n+ GaAs layer 12 is formed. The reason why the mesa groove 14 is formed is described hereinafter. According to this variation, as described above, the GaAs layer is not grown on the Si substrate surface of the mesa groove in the step shown in FIG. 6(d). In this GaAs layer growing process, since the reactive gases reaching the mesa groove do not deposit GaAs on the Si substrate, the gases are used for GaAs growth in the vicinity of the mesa groove. Therefore, as shown in FIG. 7, the grown layer becomes thicker in the vicinity of the mesa groove and specially its edge part is sharply swollen. Since mechanical stress is concentrated in this thicker part, many cracks are generated from this part. Therefore, the mesa grooves 14 shown in FIG. 6(e) are formed by selectively removing the swollen part.

Figure 8:
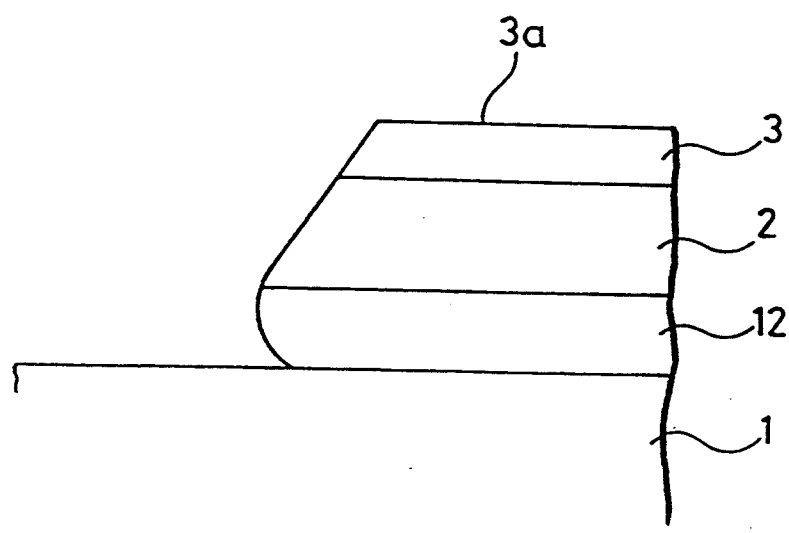
FIG. 8 is an enlarged view in the vicinity of the mesa in the step shown in FIG. 6(e)

FIG. 8 is a view showing an example of a sectional structure of the GaAs layer in the vicinity of the mesa groove, in which stress concentration in the vicinity of the element can be reduced as much as possible in accordance with the variation of the third embodiment of the present invention. As shown in FIG. 8, the angle formed between a side surface of the p type GaAs layer 2 and the n type GaAs layer 3 and a p type GaAs layer surface 3a is set at 90° or more to prevent the stress from being concentrated in an acute angle part. This configuration can be easily formed by a method such as forward mesa etching in the GaAs layer having a growing surface in the vicinity of (100) surface. Alternatively, the above structure can be formed by reducing the adhesive strength between the photoresist and the GaAs layer in the vicinity of the mesa groove to accelerate etching at an interface between the photoresist and GaAs. In addition, referring to FIG. 8, since the contact angle formed between the n+ GaAs layer and an interface against the Si substrate is an obtuse angle, stress is prevented from being concentrated. This configuration can be easily formed by using an etchant in which etching speed depends on the stress. More specifically, since the stress is largest at the interface against the Si substrate in the n+ GaAs layer and it becomes smaller away from that, the configuration shown in FIG. 8 can be etched away using a solution of sulfuric acid, hydrogen peroxide, and water as an etchant for GaAs.

Figure 9:
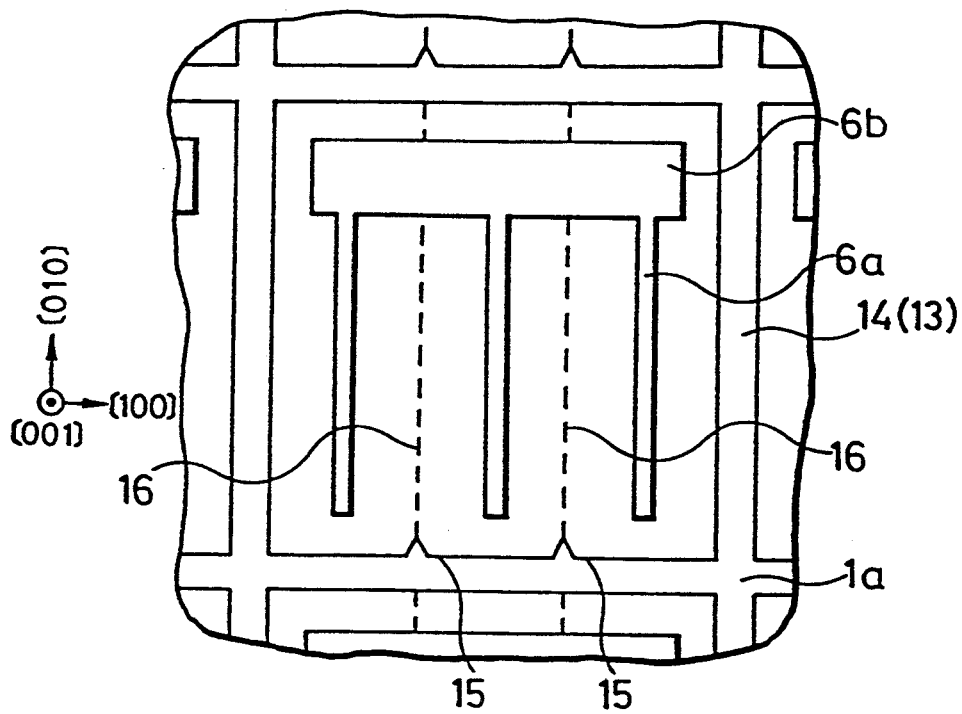
FIG. 9 is a plan view showing a GaAs solar cell on a Si substrate during manufacturing in accordance with a fourth embodiment of the present invention.

Next, a fourth embodiment of the present invention will be described hereinafter. FIG. 9 is a plan view showing a method for manufacturing a solar cell in accordance with the fourth embodiment of the present invention.

Next, its manufacturing steps will be described.

The n+ GaAs buffer layer is formed on the Si substrate and then the mesa groove 13 is formed by selectively etching the n+ GaAs layer. At this time, a wedge-shaped concave part 15 whose bottom reaches the Si surface is provided on at least one side of the mesa groove. When the pattern shown in FIG. 9 is used as a mask for forming the mesa groove, this concave part can be formed during the same step for forming the above mesa groove 13. Then, the n type GaAs layer and the p type GaAs layer which serve as active layers are formed. Although they are selectively grown at a part in which the n+ GaAs layer remains, since stress is concentrated in the vicinity of the grown layer as described above, when the wedge-shaped concave part is formed in accordance with this embodiment of the present invention, a crack 16 is generated from its end as shown in FIG. 9. Then, the p type electrode 6 is formed and then finally the new mesa groove 14 is formed by removing a peripheral part of the mesa groove, which is the same as the variation of the third embodiment of the present invention. At this time, the peripheral part of the wedge-shaped concave part is also etched away. As described above, since the wedge-shaped concave part is previously formed to intentionally generate a crack from this part in this fourth embodiment of the present invention, stress is relieved and the crack is prevented from being generated later.

Figure 10:
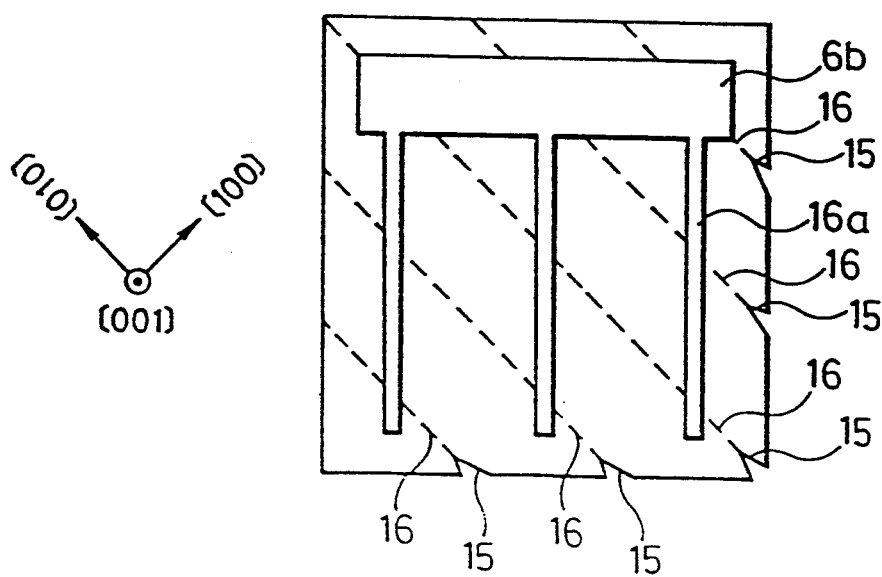
FIG. 10 is a plan view showing a GaAs solar cell on a Si substrate in accordance with a variation of the fourth embodiment of the present invention.

In addition, when the wedge-shaped concave part 15 is formed at the center between the collecting electrodes 6a as shown in FIG. 9, a photoelectric current collected by one grid electrode is well balanced in the right and left directions and it is possible to prevent spreading resistance from being increased, which spreading resistance is caused by imbalanced collection of current due to the crack. In addition, in this case, when the crystal surface orientation is [001], the direction in which the collecting electrode 6a is arranged runs almost parallel with the direction in which the crack 16 is generated, which direction is [010]. As described above, according to the embodiment of the present invention shown in FIG. 9, generation of the crack 16 is controlled and its influence can be minimized. However, it is not possible to completely prevent the crack from being newly generated for some reason between the collecting electrodes 6a. In this case, the increase of the spreading resistance is proportional to the square of the ratio of the length of the maximum electrode 6b to an arrangement distance. For example, when the former is 2 cm and the latter is 1 mm, the spreading resistance becomes 400-fold. In order to reduce the above influence, it is effective to shift the direction in which the crack is generated from the end of the wedge so as not to be parallel with the direction of the collecting electrode. As shown in the variation in FIG. 10, it is most effective when both cross at an angle of 45 degrees. According to this variation, an increase of the spreading resistance is twofold at the most.

Figure 11:
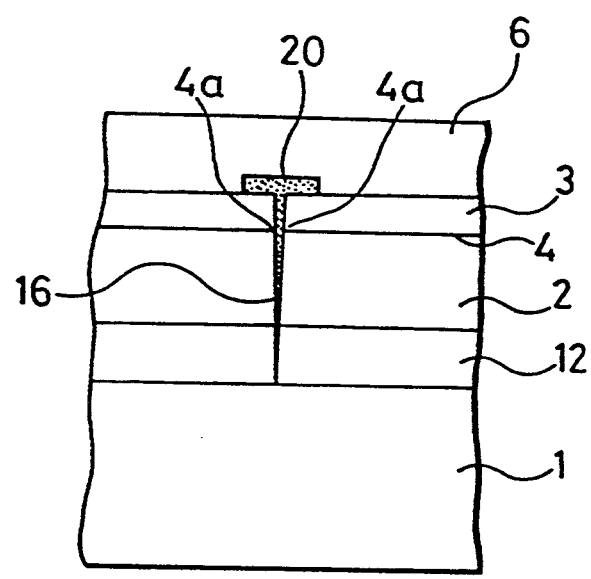
FIG. 11 is a sectional view in the vicinity of a crack, whose generation is controlled, in the GaAs solar cell on the Si substrate in accordance with the variation of the fourth embodiment of the present invention.

FIG. 11 is a sectional view in the vicinity of the crack 16 whose generation is controlled in accordance with the fourth embodiment of the present invention. Since the pn junction 4 is exposed because the crack 16 is generated, this part is coated with an insulating film 20 formed of a material such as $Si_3N_4$ or $SiO_2$. In general, when the exposed pn junction end face 4a is left in the air, a leakage current is generated because water, a foreign material or the like becomes attached thereto, with the result that the characteristic of the solar cell could be degraded. Therefore, that part is passivated with the insulating film, so that the leakage current can be prevented.

In addition, after the crack is generated, when metal is deposited in the step of forming an electrode, the pn junction could be short-circuited when the metal enters the crack. Therefore, when the exposed end face 4a of the pn junction is protected with the insulating film 20 before the electrode is formed and then the second electrode 6 is formed, the pn junction can be prevented from being short-circuited. Meanwhile, if the insulating film is formed on the whole surface of the lower part of the second electrode, current can not be taken out. Therefore, the insulating film should be left only in the vicinity of the crack and a contact hole is formed in another part. The above step is possible when generation of the crack 16 is controlled as described in this embodiment of the present invention. More specifically, when generation of the crack is controlled, the position of the crack can be specified and then the pattern of the contact hole can be specified. As described above, according to the fourth embodiment of the present invention, an electrode capable of protecting the pn junction can be formed.

Figure 12:
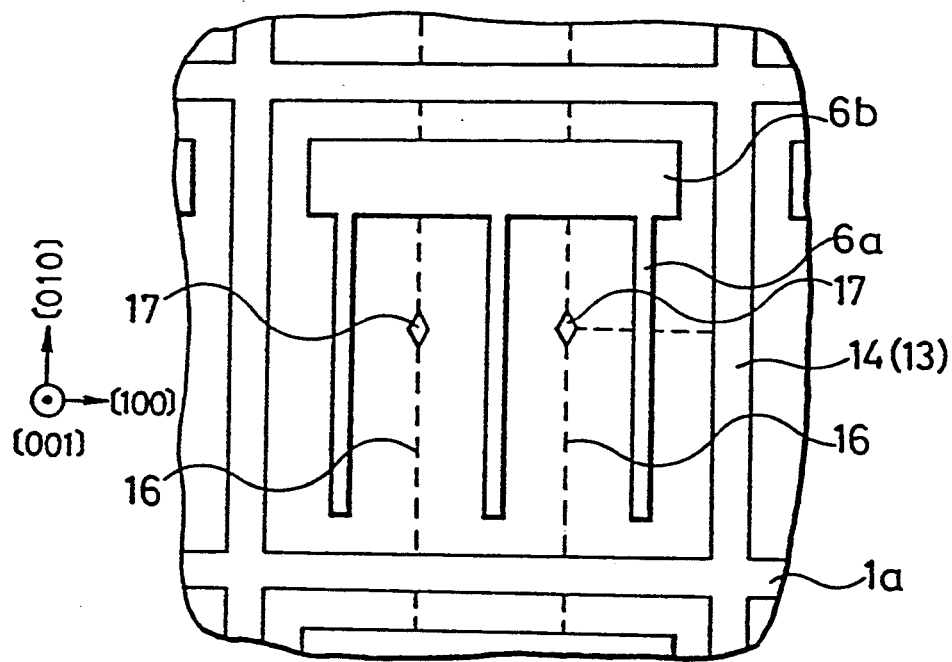
FIG. 12 is a plan view showing a GaAs solar cell on a Si substrate during manufacturing in accordance with another variation of the fourth embodiment of the present invention.
Figure 13:
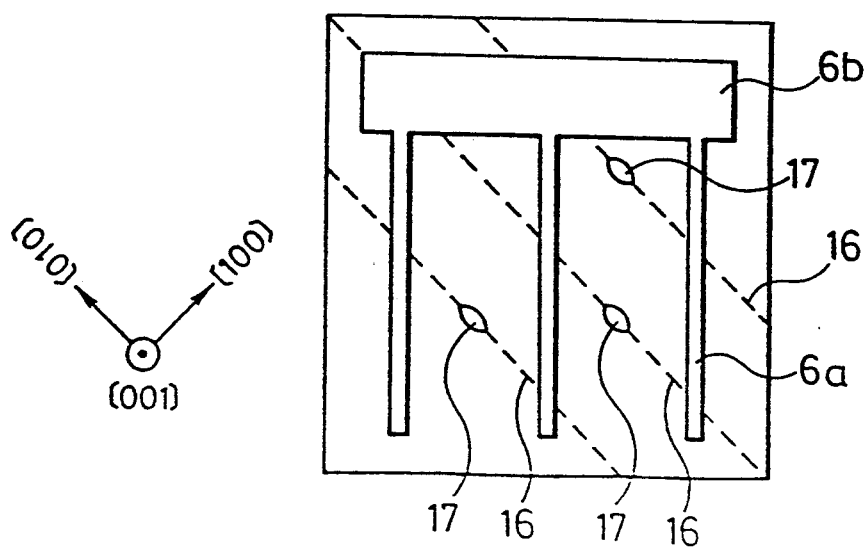
FIG. 13 is a plan view showing a GaAs solar cell on a Si substrate in accordance with still another variation of the fourth embodiment of the present invention.

FIG. 12 is a plan view showing another variation of the fourth embodiment of the present invention. According to this variation, the n+ GaAs buffer layer is formed on the Si substrate and then the mesa groove 13 is formed by selectively etching the n+ GaAs layer. At this time, a plurality of rhombic concave parts 17 are formed in the n+ GaAs layer as islands. This concave part can be formed during the same step of forming the mesa groove 13 like the embodiment shown in FIG. 9. Then, when the n type GaAs layer and the p type GaAs layer are formed, the crack 16 is generated from a part of the acute angle of the rhombus. Although the crack is rarely generated from a part of the obtuse angle of the rhombus, even if it is generated, it has no substantial influence because it crosses the collecting electrode at right angles. However, in order to prevent the latter crack, the concave part may have a configuration formed of two circular arcs which are circumscribe the rhombus like still another variation of the fourth embodiment of the present invention shown in FIG. 13. The two circular arcs preferably form an angle of no more than 90° where they intersect. According to this embodiment of the present invention, if the rhombic concave part is also provided at the center of the collecting electrodes 6a, the same effect described in FIG. 9 can be obtained. In addition, when a diagonal line connected to the acute angle parts crosses the collecting electrode 6a at an angle of 45 degrees as shown in FIG. 13, the influence of a crack which is accidentally generated from the part other than this concave part can be minimized like the embodiment shown in FIG. 10.

Figure 14A:
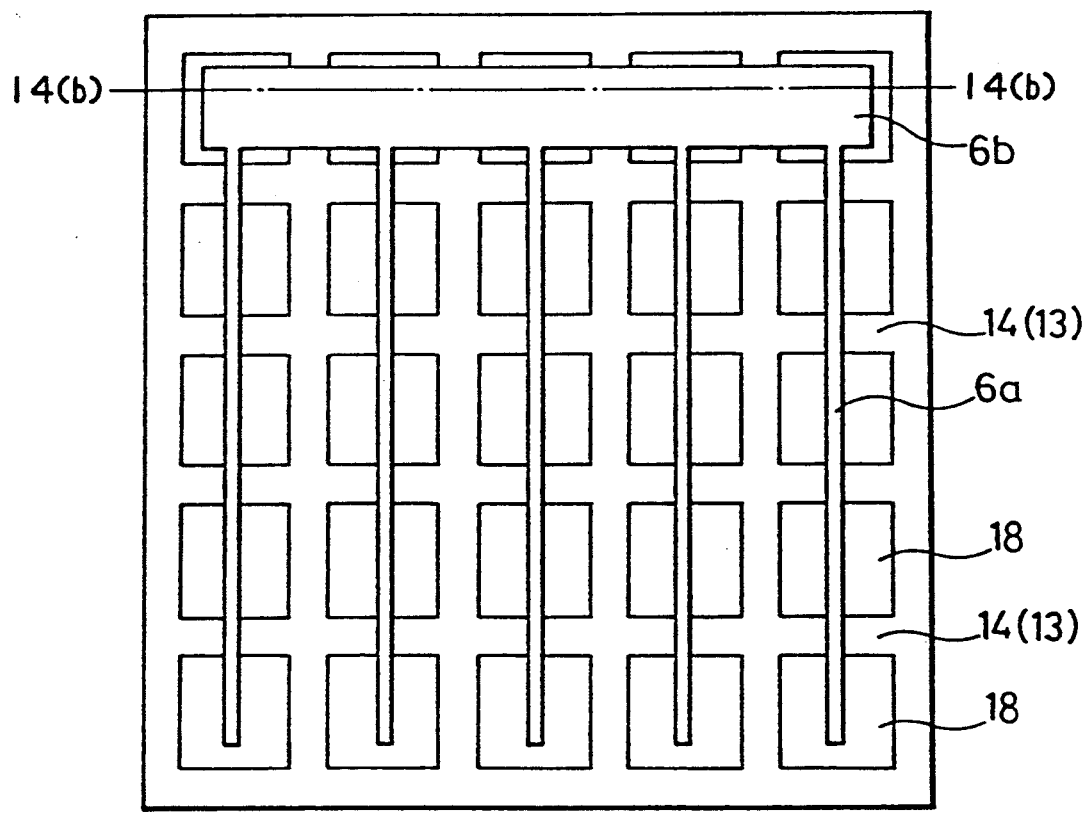
FIG. 14(a) is a plan view showing a GaAs solar cell on a Si substrate in accordance with a fifth embodiment of the present invention and FIG. 14(b) is a sectional view taken along a line 14(b)–14(b) in FIG. 14(a)
Figure 14B:
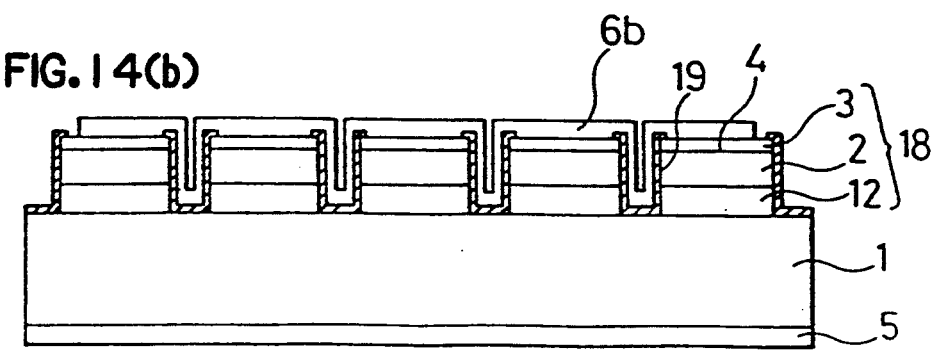

Next, a fifth embodiment of the present invention will be described hereinafter. FIGS. 14(a) and 14(b) are views showing a solar cell in accordance with the fifth embodiment of the present invention, in which FIG. 14(a) is a plan view and FIG. 14(b) is a sectional view taken along a line 14(b)-14(b) in FIG. 14(a). The solar cell in accordance with the fifth embodiment of the present invention is formed as follows.

The n+ GaAs buffer layer 12 is formed on the Si substrate and then the intersecting mesa grooves 13 are provided so that a plurality of islands 18 of n+ GaAs buffer layer are formed in one element. Then, when the n type GaAs layer 2 and the p type GaAs layer 3 are grown as described above, they are selectively grown only at the island part in which the n+ GaAs layer remains. Then, the GaAs layer in the vicinity of each island 18 is removed and then the mesa grooves which are a little larger than the mesa grooves 13 is provided. Then, the pn junction exposed on the side is protected with the insulating film 19. Finally, the n type electrode 5 is formed on the second main surface of the n type Si substrate and the p type electrode 6 comprising the collecting electrodes 6a and the common electrode 6b is formed on the p type GaAs layer surface. In this case, at least one collecting electrode 6a or the common electrode 6b is provided in each island 18. As described above, according to the fifth embodiment of the present invention, since a plurality of islands of the GaAs layer are provided in one element, the size of the GaAs layer becomes small and then residual stress in the vicinity of the GaAs layer is reduced, so that cracking is prevented. In addition, even if one crack is generated, it spreads only in one island, so that its influence can be minimized.

Figure 15:
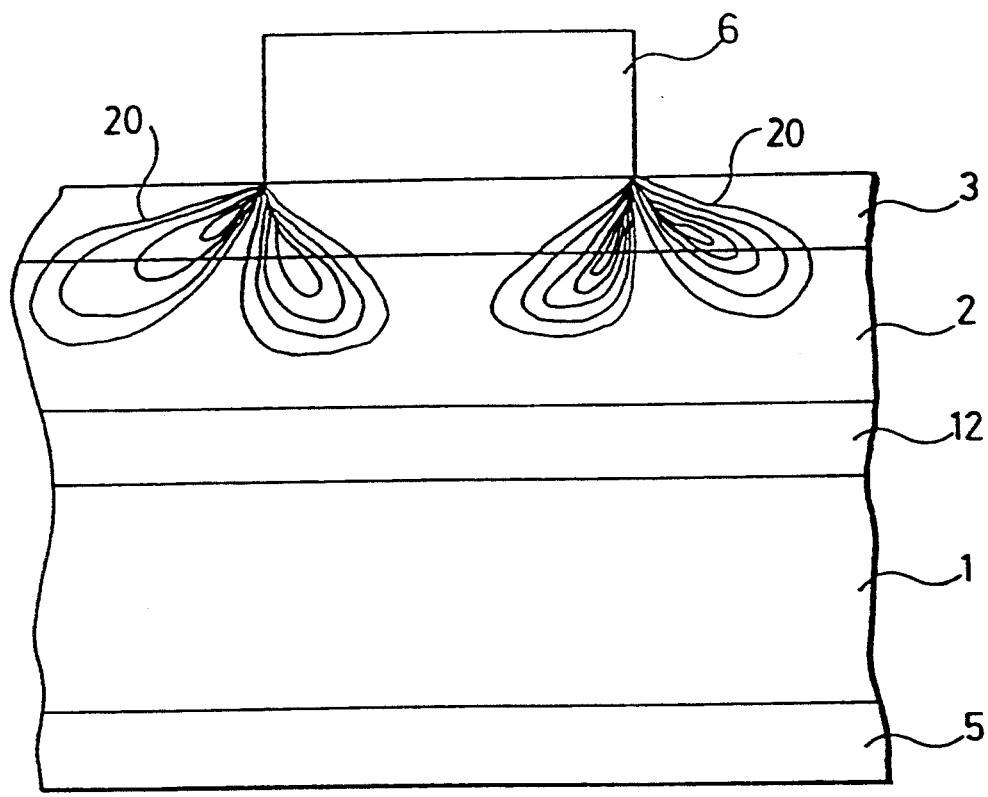
FIG. 15 is a schematic view showing stress generated in the vicinity of a second electrode.

Next, a sixth embodiment of the present invention will be described hereinafter. FIG. 15 is a schematic view showing stress applied to the GaAs layer by the p type electrode 6. In FIG. 15, reference numeral 20 designates a contour line of stress. As shown by the line, the stress is concentrated in the vicinity of the electrode. This stress is generated by the difference in thermal expansion coefficients of the electrode material and the GaAs layer, whose strength depends on the thermal expansion coefficient, hardness and thickness of the electrode material. As the conventional p type electrode, Ag having a thickness of 4 μm formed on Ti having a thickness of 500 Å is used and a crack is generated because of this p type electrode. According to the sixth embodiment of the present invention, as the p type electrode, Au having a thickness of 2 μm formed on Ti having a thickness of 500 Å is used. Since the electrode is formed of metal which is likely to be plastically deformed, generation of a crack due to the electrode can be prevented. More specifically, the reason why the crack is prevented from being generated is that the stress applied to the GaAs layer is reduced because the thermal expansion coefficient of Au is $1.5 \times 10^{-5}$ (1/° C.), which is smaller than the thermal expansion coefficient $2.1 \times 10^{-5}$ (1/° C.) of Ag and close to the thermal expansion coefficient $6 \times 10^{-6}$ (1/° C.) of the GaAs layer. Au is superior to Ag in view of malleability and it is a soft material which is likely to be plastically deformed. In addition, the stress is reduced because the electrode has a thickness of 2 μm. When the thickness of the electrode is thin, a curvilinear factor could be reduced because electrode resistance is increased. However, when the solar cell is formed with an electrode having the above thickness, its characteristic bears comparison with that formed of the electrode having a thickness of 4 μm.

Next, a seventh embodiment of the present invention will be described hereinafter. FIG. 16 is a view showing a GaAs solar cell on a Si substrate in accordance with the seventh embodiment of the present invention. According to the seventh embodiment of the present invention, the n type electrodes 5 are separately formed on the second main surface of the Si substrate 1. In this structure, stress applied to the GaAs layers 2 and 3 is reduced as compared with the case where the electrode is formed on the whole surface of the second main surface of the Si substrate 1 as in the conventional device. Since a metal material forming the n type electrode has a thermal expansion coefficient larger than that of Si, when it is cooled down at a low temperature of approximately −200° C. in a thermal shock test, the n type electrode is compressed and then a tensile stress is applied to the GaAs layers 2 and 3. Therefore, when the n type electrode 5 is formed on the whole surface of the second main surface of the Si substrate 1, this tensile stress is large. If this tensile stress is applied to the GaAs layers 2 and 3 in which a tensile stress caused by a difference in thermal expansion coefficient between Si and GaAs exists, a crack is easily generated. Therefore, when the n type electrodes 5 are separately formed, the tensile stress is reduced and a crack is prevented from being generated. In addition, according to the embodiment shown in FIG. 5, although the BN film 10' is conductive, this is not necessarily conductive and metal electrodes 11 which are separately formed can be used as the n type electrode 5. In this case, a compressive stress is applied to the GaAs layers 2 and 3 by the BN film at a low temperature and then the tensile stress caused by the difference in thermal expansion coefficients of Si and GaAs can be offset. Thus, according to the embodiment of the present invention in FIG. 16, the crack is further prevented from being generated.

Figure 20A:
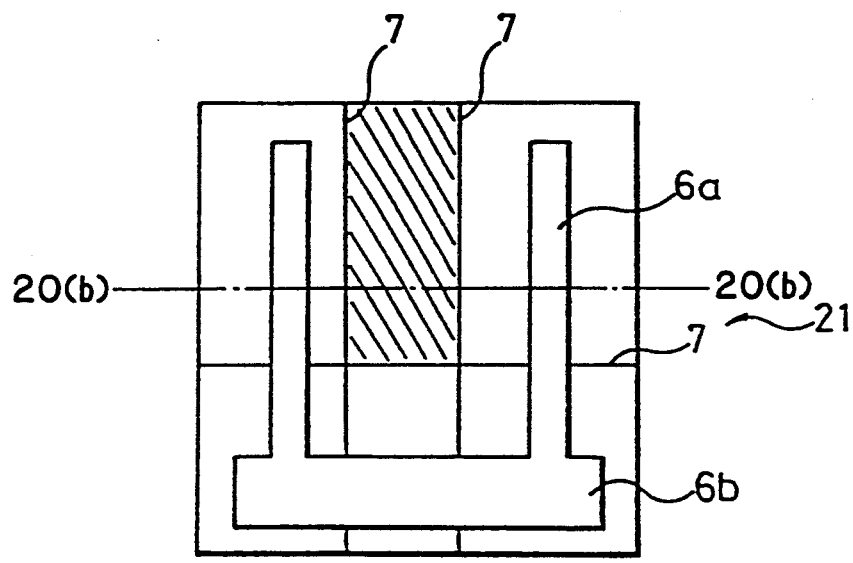
FIGS. 20(a), 20(b) and 21 are views each showing a conventional GaAs solar cell on a Si substrate.
Figure 20B:
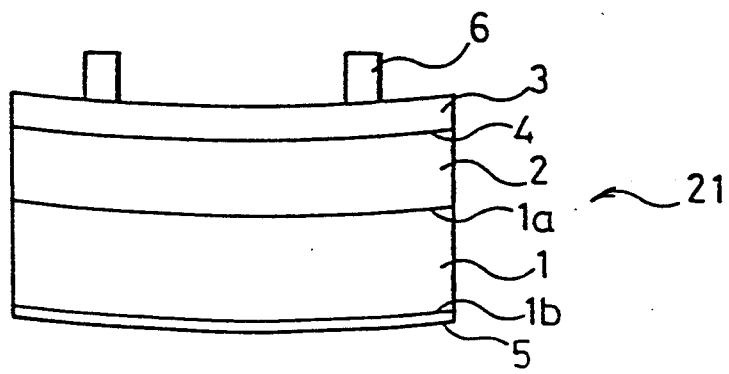
Figure 21:
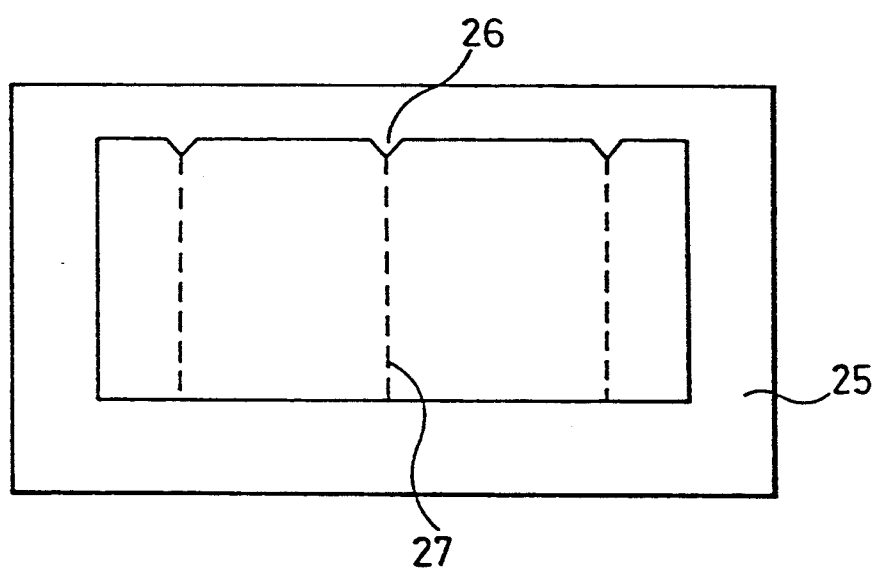

Next, an eighth embodiment of the present invention will be described hereinafter. FIG. 17 is a view showing a GaAs solar cell on the Si substrate in accordance with the eighth embodiment of the present invention. According to the eighth embodiment of the present invention, the collecting electrode 6a of the second electrode 6 is formed like a grid, which forms a closed loop. Thus, when the pattern of the collecting electrode 6a is formed like a closed loop, it is possible to collect a photoelectric current generated in the region separated by two or more cracks 7, which can not collected by the conventional comblike pattern shown in FIG. 20.

Figure 18:
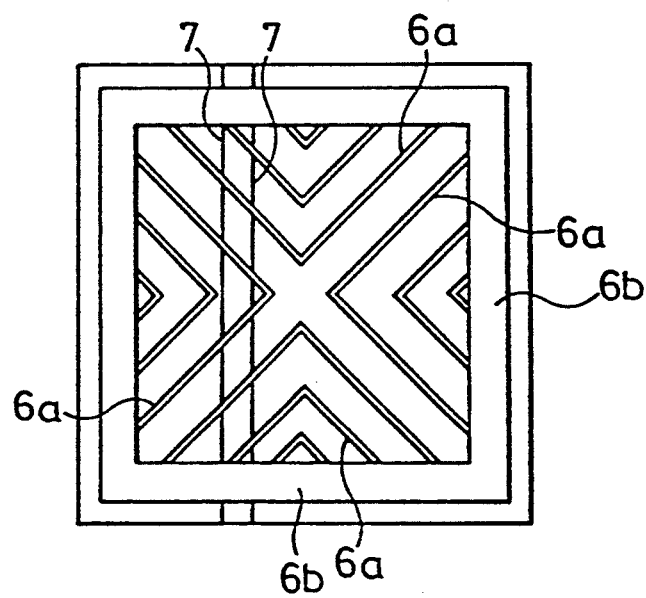
FIG. 18 is a plan view showing a GaAs solar cell on a Si substrate in accordance with a variation of the eighth embodiment of the present invention.

FIG. 18 is a view showing a solar cell in accordance with a variation of the eighth embodiment of the present invention. In this case, the common electrode 6b is formed on four sides in the vicinity of the element and the collecting electrode 6a forming a closed loop is connected to each of the common electrodes 6b. In this case also, it is possible to collect the photoelectric current generated at a region surrounded by two cracks 7. Thus, according to these embodiments of the present invention, the influence of a crack can be reduced.

Figure 19:
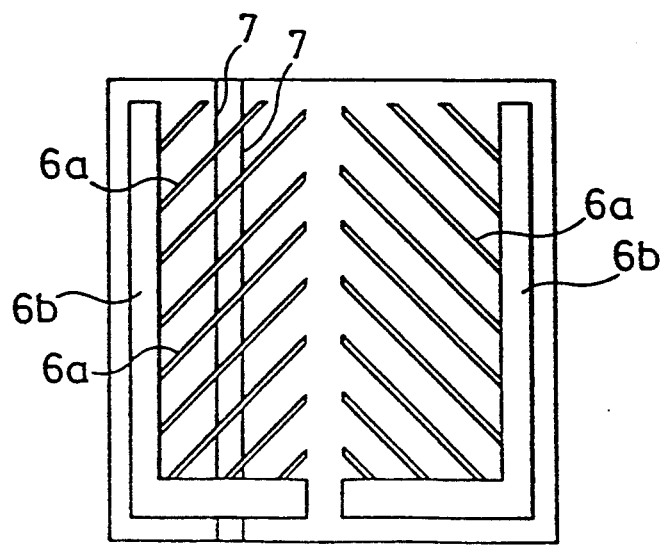
FIG. 19 is a plan view showing a GaAs solar cell on a Si substrate in accordance with another variation of the eighth embodiment of the present invention.

FIG. 19 is a view showing a solar cell in accordance with another variation of the eighth embodiment of the present invention. According to this variation, two common electrodes 6b are provided and the collecting electrodes 6a are connected to each of the common electrodes at angles other than 90° so that the collecting electrodes 6a may cross the crack 7. In this case, when the orientation of the GaAs crystal surface is {100}, a crack is likely to be generated in the <100> direction. Then, if the common electrodes 6b are arranged in the <100> direction, the collecting electrodes 6a which do not cross at a right angle to the common electrodes 6b do not cross at a right angle to the crack 7. As a result, it is possible to collect the photoelectric current also from the region divided by two or more cracks 7 and then the influence exerted by generation of the crack can be reduced.

As described above, according to the method for manufacturing a GaAs solar cell on a Si substrate of the present invention, a layer comprising a material having a thermal expansion coefficient smaller than that of the Si substrate is formed on the second main surface of the first conductivity type Si substrate at a temperature close to room temperature and then the first and second GaAs layers of first and second conductivity types which serve as active layers are formed on the first main surface of the Si substrate. As a result, residual stress in the GaAs layer can be reduced and the degree of warpage can be also reduced, so that a flatter epitaxial wafer can be obtained and there is provided a GaAs solar cell on the Si substrate which has no or few cracks.

In addition, according to a GaAs solar cell on a Si substrate of the present invention, before the first and second GaAs layers of the first and second conductivity types which serve as active layers are formed on the first main surface of the first conductivity type Si substrate, a layer comprising a conductive material having a thermal expansion coefficient smaller than that of Si is formed on the second main surface of the Si substrate at a temperature close to the room temperature. As a result, in addition to the effect obtained by the above manufacturing method of the present invention, the step of newly forming the first electrode is not necessary and then the manufacturing process can be simplified. In addition, even if the temperature becomes lower than room temperature in a thermal shock test or the like, a compressive stress is applied to the GaAs layer, which offsets the residual tensile stress. As a result, the crack is prevented from being generated.

According to the method for manufacturing a GaAs solar cell on a Si substrate of the present invention, a GaAs buffer layer containing a dopant impurity producing the first conductivity type in high concentration is formed on the first main surface of the first conductivity type Si substrate and then a layer comprising a material having a thermal expansion coefficient smaller than that of the Si substrate is formed on the second main surface of the substrate at a temperature close to room temperature and then first and second GaAs layers of the first and second conductivity types are sequentially formed on the buffer layer. As a result, there can be provided a GaAs active layer which has no thermal stress on the clean Si substrate surface.

In addition, according to the method for manufacturing a GaAs solar cell on the Si substrate of the present invention, a GaAs buffer layer containing a high concentration of a dopant impurity producing the first conductivity type is formed on the first main surface of a first conductivity type Si substrate and then a wedge-shaped notched part is formed on a side of the buffer layer or a pinhole of predetermined configuration is provided on the buffer layer. The active layer comprising the GaAs layers of the first and second conductivity types and having a crack generated from the end of the wedge-shaped notched part or from the pinhole is formed on the buffer layer. As a result, the active layer can be formed on the clean Si substrate surface and the thermal stress can be relieved by intentionally generating the crack. Thus, the crack is prevented from being accidentally generated later and the characteristic of the solar cell can be prevented from being considerably degraded.

In addition, according to a GaAs solar cell on a Si substrate of the present invention, a GaAs buffer layer containing a high concentration of a dopant, impurity producing the first conductivity type is formed on the first main surface of a first conductivity type Si substrate and divided by intersecting mesa grooves, whereby the solar cell comprises a plurality of island-shaped buffer layers in one element region and active layers comprising the first and second GaAs layers of the first and second conductivity types which are sequentially formed on each island-shaped buffer layer, in which at least one second conductivity type collecting electrode connected to the common electrode is connected to the second conductivity type GaAs layer in each island. As a result, since the size of the active layer in each island is small, the mechanical force acting on the GaAs crystal is reduced and a crack is prevented from being generated. Thus, even if the crack is generated, it spreads only in that island and does not spread to other islands, so that the influence exerted by generation of the crack can be minimized.

In addition, according to a GaAs solar cell on a Si substrate of the present invention, at least one of the electrode on the substrate and the electrode on the light input side is formed of metal which is likely to be plastically deformed as the base material. As a result, a crack caused by stress of the electrodes can be prevented from being generated.

In addition, according to a GaAs solar cell on a Si substrate of the present invention, the electrodes on the substrate side are separately arranged on the second main surface of the Si substrate. As the result, a tensile stress toward the GaAs layer by the first electrode is reduced and then the crack is prevented from being generated at a low temperature in a thermal shock test or the like.

In addition, according to a GaAs solar cell on a Si substrate of the present invention, there is provided an electrode on the light input side which is patterned so that the collecting electrode is not connected to a region divided by another active region is not likely to occur when a crack is generated in the active layer. As a result, even when the crack is generated later, a loss region is prevented from being generated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a solar cell, comprising:
   depositing a GaAs buffer layer containing a high concentration of a dopant impurity producing a first conductivity type on a first main surface of a Si substrate;
   etching a groove through said buffer layer to said Si substrate, thereby forming a side wall of said buffer layer;
   forming at least one wedge-shaped notch in said side wall of said buffer layer;
   depositing an active layer comprising a first conductivity type GaAs layer and a second conductivity type GaAs layer on said buffer layer, thereby forming a pn junction, said active layer having at least one crack extending from the at least one wedge-shaped notch, thereby exposing part of said pn junction; and
   forming at least one current collecting electrode having a plurality of spaced apart grid fingers on said active layer.

2. A method for manufacturing a solar cell in accordance with claim 1 wherein the at least one crack extending from said at least one wedge-shaped notch is positioned in the spaces between adjacent grid fingers of said current collecting electrode.

3. A method for manufacturing a solar cell in accordance with claim 1 wherein the said at least one crack is oblique to said grid fingers of said current collecting electrode.

4. A method for manufacturing a solar cell in accordance with claim 1 including covering the part of the pn junction exposed by the at least one crack with an insulating film.

5. A method for manufacturing a solar cell in accordance with claim 4 including covering with said insulating film the exposed part of said pn junction before forming said current collecting electrode.

6. A method for manufacturing a solar cell in accordance with claim 5 including forming the grid fingers of said current collecting electrode on said insulating film such that they cross the at least one crack.

7. A method for manufacturing a solar cell, comprising:
   depositing a GaAs buffer layer containing a high concentration of a dopant impurity producing a first conductivity type on a first main surface of a Si substrate;
   forming at least one pinhole of predetermined configuration in said buffer layer;
   depositing an active layer comprising a first conductivity type GaAs layer and a second conductivity type GaAs layer on said buffer layer, thereby forming a pn junction, said active layer having at least one crack extending from the at least one pinhole, thereby exposing a part of said pn junction; and
   forming at least one current collecting electrode having a plurality of spaced apart grid fingers on said active layer.

8. A method for manufacturing a solar cell in accordance with claim 7 wherein the at least one pinhole has a shape of a rhombus.

9. A method for manufacturing a solar cell in accordance with claim 8 including forming a said at least one pinhole in the spaces between adjacent grid fingers of said current collecting electrodes.

10. A method for manufacturing a solar cell in accordance with claim 8 wherein a diagonal line connected to vertexes of the rhombus is parallel to a direction of cleavage of said GaAs active and buffer layers and is not parallel to and does not cross said grid fingers of said current collecting electrode at right angles.

11. A method for manufacturing a solar cell in accordance with claim 10 wherein the angle formed between the diagonal line and said grid fingers of said current collecting electrode is approximately 45 degrees.

12. A method for manufacturing a solar cell in accordance with claim 8 including removing said active layer and said buffer layer in the vicinity of the at least one pinhole after a crack is generated therefrom.

13. A method for manufacturing a solar cell in accordance with claim 7 wherein the at least one crack is oblique to said grid fingers of said current collecting electrode.

14. A method for manufacturing a solar cell in accordance with claim 7 including covering the part of the pn junction exposed by the at least one crack with an insulating film.

15. A method for manufacturing a solar cell in accordance with claim 14 including covering with said insulating film the exposed part of said pn junction before forming said current collecting electrode.

16. A method for manufacturing a solar cell in accordance with claim 15 including forming said grid fingers of said current collecting electrode on said insulating film such that they cross the at least one crack.

17. A method for manufacturing a solar cell in accordance with claim 7 wherein the shape of the pinhole on said buffer layer is defined by two circular arcs circumscribing a rhombus and intersecting to form an angle between the two circular arcs which is no more than 90 degrees.

* * * * *